RADIATION RESISTANT SEMICONDUCTIVE DEVICE

Filed April 29, 1968

3,547,717

RADIATION RESISTANT SEMICONDUCTIVE DEVICE

Joseph Lindmayer, Williamstown, Mass., assignor to Sprague Electric Company, North Adams, Mass.

Filed Apr. 29, 1968, Ser. No. 724,914
Int. Cl. H01l 7/44, 11/14
U.S. Cl. 148—187 6 Claims

ABSTRACT OF THE DISCLOSURE

The oxide gate insulation overlying a channel formed by spaced apart regions of a semiconductive body has its non-regular bond sites filled with chromium and oxides thereof to provide a radiation resistant device.

BACKGROUND OF THE INVENTION

This invention relates to semiconductive devices, and more particularly to an insulated gate field effect transistor having high radiation resistance and to a method of making the same.

Prior art components generally exhibit deterioration under irradiation such that circuit reliability is reduced even to the extent of causing severe circuit malfunction. In this regard, it had been anticipated that insulated gate field effect transistors, hereinafter called MOS transistors, would be more radiation resistant than bipolar devices since operation of the former is not strongly dependent upon the crystallographic order of the semiconductive body. Unfortunately, however, MOS transistors are strongly dependent upon the gate dielectric which is not generally monocrystalline, and hence, transistors of this type have also failed to exhibit satisfactory radiation hardness.

One object of this invention is to provide a semi-conductive device having high radiation resistance.

Another object of this invention is to provide a semiconductive device having a passivating oxide coating which exhibits considerable stability under irradiation.

A further object of this invention is to provide an MOS transistor having high radiation resistance.

A still further object of this invention is to provide a MOS transistor whose gate insulation is an oxide stabilized by the addition of chromium.

A further object of this invention is to provide a method of making an oxide coated semiconductive device having high radiation resistance.

A still further object of this invention is to provide a method of stabilizing an oxide by the addition of chromium and its oxides thereto.

These and other objects of the invention will be apparent from the following specification and claims taken in conjunction with the drawing.

SUMMARY OF THE INVENTION

Broadly a radiation resistant semiconductive device provided in accordance with the invention comprises a semiconductive body having an oxide surface coating thereon which has its non-regular bond sites filled with chromium.

In a more limited sense, a semiconductive device constructed in accordance with the invention comprises a semi-conductive body of one conductivity type having spaced apart regions of the other conductivity type therein which form a channel area of said body therebetween, an oxide coating overlying said body at least in the area of said channel, and said coating having its non-regular bond sites filled with chromium and oxides thereof.

Briefly, the method includes the steps of forming an oxide coating overlying a semiconductive body, and heat treating the coating in a non-reactive environment to empty sites of incomplete or non-regular bonds and then heat treating it in the presence of chromium to fill these sites with chromium and/or its oxides.

DESCRIPTION OF THE PREFERRED EMBODIMENTS

Figure 1:
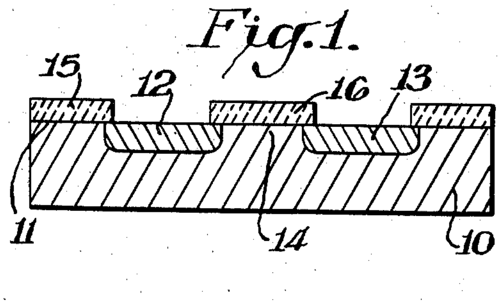
FIG. 1 is a view in section of a partially completed MOS transistor.

FIG. 1 shows a monocrystalline body 10 of semiconductive material such as silicon or the like having a pair of spaced apart regions 12 and 13 adjacent an upper surface 11. Regions 12 and 13 are of a conductivity type opposite to that of body 10 and form a channel region 14 in the separation between them. A dielectric coating 15 such as silicon dioxide or the like overlies surface 11. Openings through the coating are provided to regions 12, 13 and coating 15 is reduced in thickness in the area over channel 14 to provide a gate insulator 16.

Figure 2:
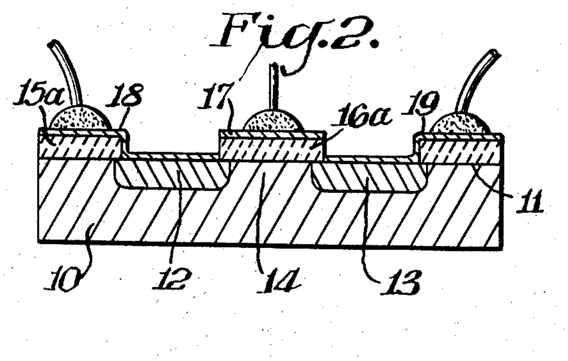
FIG. 2 is a view in section of a completed transistor produced in accordance with the invention.

FIG. 2 shows the completed MOS transistor having a metallic gate layer 17 of chromium or the like overlying a modified gate oxide **16*a* and metallic contacts 18 and 19 in connection to regions 12 and 13** respectively.

In the preferred embodiment, chromium is employed for contacts 18 and 19 as well as gate electrode 17, and chromium is also diffused within the oxide **15*a*** underlying these contacts, however, since stability of the gate insulator is of primary importance in the MOS structure, the latter is emphasized in the description. It being understood that depending upon the type of structure, any or all of the oxide would be modified by chromium or its oxides, and in any structure it would be of some advantage to modify the oxide overlying any junctions.

Figure 3:
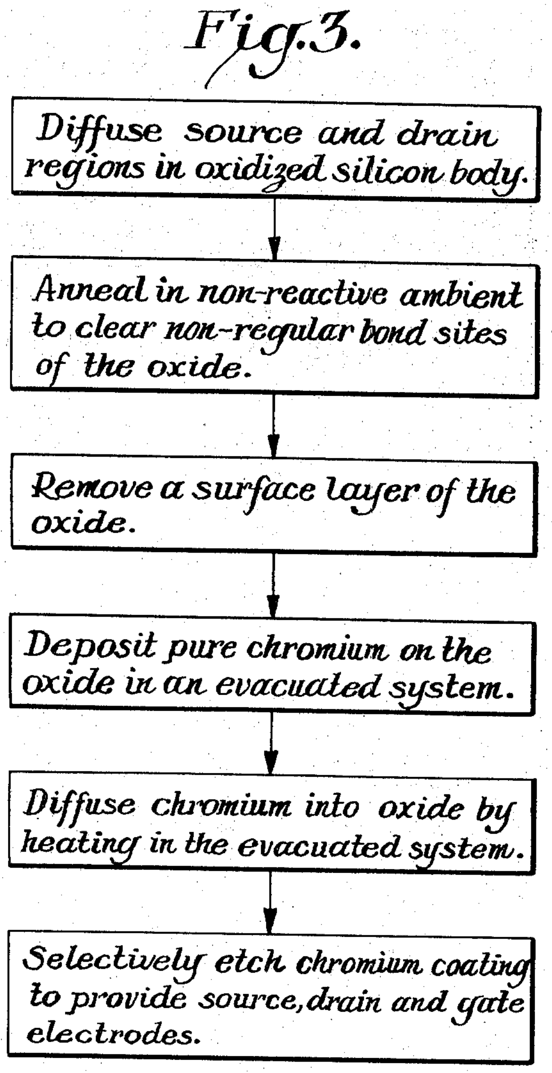
FIG. 3 is a flow chart identifying steps in a method of producing a semiconductive device having high radiation resistance.

The unit of FIG. 2 is constructed in a preferred method as set out in the flow chart of FIG. 3. In a first step, spaced apart regions of one conductivity type are formed by conventional means within an oxidized body of monocrystalline semiconductive material of the other conductivity type. The regions are formed, for example, by diffusion or the like through openings in the oxide.

Thereafter the body is heated to above 400° C. in a non-reactive environment, that is one which inhibits oxide growth, for example a nitrogen atmosphere or other neutral gas. This treatment breaks any non-regular or incomplete bonds of the coating and empties the sites of these non-regular bonds. It is believed that these sites of incomplete or "minor" bonds are mostly OH sites formed by the inherent inclusion of hydrogen within the coating during its thermal growth, and that heating in a neutral gas breaks up the site, allows the hydrogen to escape, and holds the site empty and available for stable bonding with diffused chromium in a later step.

Before metallization, a thin outer layer (for example 300 angstroms) of oxide is then removed by etching or the like, and openings to the spaced apart regions are provided. Then, in an evacuated system chromium is deposited over the oxide and exposed surfaces of the regions, and the chromium is then diffused within the oxide by again heating the slice.

Preferably, the chromium is deposited within an evacuated system, for example, by electron beam deposition in which pure chromium is vaporized by an electron beam and allowed to condense or deposit on the prepared slice. In the preferred method, the slice is then retained within the evacuated chamber during the gate diffusion step so as to avoid any possible exposure of the chromium to reactive elements and to insure diffusion of pure chromium within the oxide.

Since the deposited chromium essentially seals off the emptied oxide, it is possible to remove the slice before the gate diffusion step. Then at a later time, the slice could be chemically cleaned (to remove any surface contaminants of the chromium) and heat treated in a nonreactive atmosphere.

After removal from the vacuum chamber, the chromium coating is selectively etched to provide source, drain and gate electrodes. Finally, if desirable, leads are attached to the gate electrode and the region contacts to complete the device.

Units constructed in this manner have superior radiation hardness as compared to conventional MOS transistors, and are capable of withstanding irradiation of greater than $10^6$ rads (Si) without deterioration. In this regard, it is believed that the unsatisfactory performance of conventional MOS devices under ionizing radiation can be explained by the ionization of "minor" or "incomplete" bonds which create mobile positive charges in the oxide; and that the superior performance of the novel unit is due to the filling of these sites with chromium which is capable of forming a large number of stable oxides.

In a specific example, an N-type monocrystalline silicon slice having a resistivity of 10 ohm-cm. and spaced apart P-type regions having a surface concentration of impurities of approximately $10^{19}$ atoms/cm.$^3$ was formed by conventional means.

Thereafter, a coating of approximately 1500 angstroms thickness of silicon dioxide was formed over the body by heating it for 1½ hours at 1100° C. in an atmosphere of oxygen. Then, the unit was heated at approximately 1100° C. for about ½ hour in a nitrogen atmosphere. This was accomplished by leaving the slice in the furnace at temperature while the atmosphere was changed to nitrogen.

Next the coating was surface etched with hydrofluoric acid to remove approximately 300 angstroms of its outer surface. At this time openings to each region were also etched through the coating.

The slice was then placed in an electron beam deposition system, and the system evacuated to approximately $10^{-6}$ to $10^{-7}$ mm. of Hg. The electron beam was then directed at a pure chromium source to provide a metal vapor which is deposited on the slice. Thereafter, the structure was heated within the chamber to a temperature of around 450° for about 10 minutes to diffuse the chromium within the oxide.

The unit was then removed from the chamber and selectively etched with hydrochloric acid to separate the different contacts, and finally aluminum leads were then bonded to the source, gate and drain contacts.

Units constructed in the above manner were then irradiated at various dosages up to and exceeding $10^{-7}$ rads (Si). The effects of the radiation varied depending upon the gate bias applied during irradiation, however as compared to conventional MOS structures, the inventive units were capable of withstanding two orders of magnitude more of radiation. States otherwise, the radiation hardness of the novel unit is significantly greater than conventional units.

Many modifications are possible. The chromium may be incorporated by other diffusion techniques, and the chromium modified oxide may provide improved radiation hardness for many different semiconductive devices. For example, the chromium modified oxide may be utilized with other unipolar devices and with bipolar and microcircuit units.

Moreover, once the oxide has been modified or filled with the chromium, the chromium surface layer may be removed. In the case of a MOS, a different gate layer could then be deposited. After diffusion, the chromium gate layer may be coated with other metals etc. It should be understood, however, that since source gate diffusion may possibly occur during operating life of the MOS device, it is preferable that at least a surface coating of chromium be retained at the oxide interface.

Furthermore, although the invention has been described with regard to silicon and its oxides, many different materials may be useful. Thus many different modifications are possible, and it should be understood that the invention is not to be limited except as in the appended claims.

What is claimed is:

1. A process for making a radiation resistant semiconductive device comprising the steps of forming a body of semiconductive material having a junction extending to the surface thereof, forming an oxide coating over said junction of said body, heating said coating in a non-reactive atmosphere at a temperature above 400° C., and reheating said coating in the presence of chromium so as to diffuse said chromium therein and form stable oxides thereof.

2. The process of claim 1 wherein said body is also heated to a temperature above 400° C. in said chromium presence.

3. The process of claim 1 including depositing a layer of chromium over said coating after said first heating step and before said second heating step to provide chromium material for said diffusion during said second heating step.

4. The process of claim 3 including the removal of a thin outer layer of said coating prior to deposit of said chromium.

5. The process of claim 3 wherein said body is of silicon material having a conductivity of one conductivity type, said coating is silicon dioxide formed by thermal oxidation of said body, and including forming of spaced apart regions within said body, said regions being of opposite conductivity to that of said body and defining a channel therein, and said oxide coating is formed over said channel and provides a gate insulator, and said chromium layer forms a gate electrode.

6. The process of claim 5 wherein said oxide is also formed over other portions of said body and thereafter filled with said chromium.

References Cited

UNITED STATES PATENTS

| | | | |
|---|---|---|---|
| 3,445,924 | 5/1969 | Cheroff et al. | 29—571 |
| 3,402,081 | 9/1968 | Lehman | 148—188 |
| 3,336,661 | 8/1967 | Polinsky | 29—589 |

JOHN HUCKERT, Primary Examiner

M. H. EDLOW, Assistant Examiner

U.S. Cl. X.R.

317—235; 117—201, 212

UNITED STATES PATENT OFFICE

CERTIFICATE OF CORRECTION

Patent No. 3,547,717 Dated December 15, 1970

Inventor(s) Joseph Lindmayer

It is certified that error appears in the above-identified patent and that said Letters Patent are hereby corrected as shown below:

Column 3, line 55, "$10^{-7}$" should be -- $10^{7}$ --
Column 3, line 60, "States" should be -- Stated -

SIGNED AND SEALED MAR 2 1971

(SEAL)
Attest:

Edward M. Fletcher, Jr.
Attesting Officer

WILLIAM E. SCHUYLER, J
Commissioner of Patent